(12) United States Patent
Stewart et al.

(10) Patent No.: US 9,156,676 B2
(45) Date of Patent: Oct. 13, 2015

(54) SENSOR WITH ISOLATED DIAPHRAGM

(71) Applicant: Honeywell International Inc., Morristown, NJ (US)

(72) Inventors: Carl Stewart, Plano, TX (US); Scott E. Beck, Murphy, TX (US); Richard A. Davis, Plano, TX (US); Gilberto Morales, Arlington, TX (US)

(73) Assignee: Honeywell International Inc., Morristown, NJ (US)

( * ) Notice: Subject to any disclaimer, the term of this patent is extended or adjusted under 35 U.S.C. 154(b) by 221 days.

(21) Appl. No.: 13/859,619

(22) Filed: Apr. 9, 2013

(65) Prior Publication Data

US 2014/0298913 A1    Oct. 9, 2014

(51) Int. Cl.
*G01L 7/08* (2006.01)
*B81B 3/00* (2006.01)
*G01L 9/00* (2006.01)

(52) U.S. Cl.
CPC ............. *B81B 3/0081* (2013.01); *G01L 7/082* (2013.01); *G01L 9/0042* (2013.01); *G01L 9/0048* (2013.01); *G01L 9/0054* (2013.01); *B81B 2201/0264* (2013.01); *B81B 2203/0127* (2013.01); *B81B 2203/033* (2013.01)

(58) Field of Classification Search
None
See application file for complete search history.

(56) References Cited

U.S. PATENT DOCUMENTS

| | | | |
|---|---|---|---|
| 5,529,279 A * | 6/1996 | Beatty et al. | 251/11 |
| 7,111,518 B1 | 9/2006 | Allen et al. | |
| 7,278,309 B2 | 10/2007 | Dmytriw et al. | |
| 7,493,822 B2 | 2/2009 | Stewart et al. | |
| 7,563,692 B2 | 7/2009 | Fortin et al. | |
| 7,678,600 B2 | 3/2010 | Villa et al. | |
| 8,616,065 B2 | 12/2013 | Stewart et al. | |
| 2010/0140669 A1 * | 6/2010 | Xie | 257/254 |
| 2010/0242592 A1 | 9/2010 | Haneef et al. | |
| 2011/0252882 A1 | 10/2011 | Beck et al. | |
| 2012/0186354 A1 | 7/2012 | Okada | |
| 2012/0205653 A1 | 8/2012 | Nishikage et al. | |
| 2013/0001710 A1 | 1/2013 | Daneman et al. | |
| 2013/0087864 A1 * | 4/2013 | Ten Have | 257/419 |
| 2014/0073927 A1 * | 3/2014 | Chung | 600/459 |

OTHER PUBLICATIONS

Wang et al., "On-Chip Integration of Acceleration, Pressure, and Temperature Composite Sensor with a Single-Sided Micromachining Technique," Journal of Microelctromechanical Systems, vol. 20, No. 1, pp. 42-52, Feb. 2011.

Zhang et al., "Fabrication of Thick Silicon Dioxide Layers Using DRIE, Oxidation and Trench Refill," IEEE, pp. 160-163, 2002.

* cited by examiner

*Primary Examiner* — Andre Allen
(74) *Attorney, Agent, or Firm* — Seager, Tufte & Wickhem, LLP

(57) ABSTRACT

A sensor assembly includes a first wafer having a cavity formed therein and a second wafer bonded relative to the first wafer to form a diaphragm over the cavity. A trench is formed in the second wafer in or around the diaphragm and the trench may be filled with an isolating material to help thermally and/or electrically isolate the diaphragm. The diaphragm may support one or more sense elements. The sensor assembly may be used a flow sensor, a pressure sensor, a temperature sensor, and/or any other suitable sensor, as desired.

20 Claims, 13 Drawing Sheets

SENSOR WITH ISOLATED DIAPHRAGM

TECHNICAL FIELD

The disclosure relates generally to sensors, and more particularly, to robust sensors having a diaphragm.

BACKGROUND

Sensors are commonly used to sense one or more properties of a fluid. For example, flow sensors and pressure sensors are used in a wide variant of applications such as in industrial process control, medical devices, engines, and so on. Flow sensors are often used to measure flow rates of fluids, and provide flow signals for instrumentation and/or control. Likewise, pressure sensors are often used to measure pressure of fluids, and provide pressure signals for instrumentation and/or control. These are just a few examples of sensors that can be used to sense one or more properties of a fluid. Some sensors may be vulnerable when exposed to the fluid that is to be sensed. For example, a sensor may be vulnerable or sensitive to moisture, particulate matter, corrosive properties or other properties or conditions of a fluid to be sensed. In some cases, the accuracy and/or reliability of the sensor may be affected. A need exists for robust sensors that can withstand these and other environments and provide accurate results.

SUMMARY

This disclosure relates generally to sensors, and more particularly, to robust sensors having a diaphragm. In one illustrative embodiment, a sensor assembly includes a sense die that includes a first wafer having a cavity formed therein and a second wafer extending over the cavity to form a diaphragm. In some instances, the second wafer may have an insulating layer thereon facing the cavity. A trench may be formed in or around the diaphragm, and in some cases the trench may be at least partially filled with an insulating material, such as an oxide. The trench may extend around or extend at least substantially around a perimeter of the diaphragm. The insulating material may help thermally isolate and/or electrically isolate the diaphragm. Illustratively, the diaphragm may support one or more sense elements used to sense one or more measurands, such as flow or pressure of a fluid. The term fluid may refer to a fluid that is in a gas or liquid phase.

In another illustrative embodiment, a sensor assembly may include a first wafer having a cavity formed therein, where the cavity defines a cavity edge adjacent a first side of the first wafer. A second wafer, supported by the first side of the first wafer, may extend over the cavity to form a diaphragm of the sensor assembly. The diaphragm may have a perimeter that is defined by the cavity edge of the cavity, and one or more sense elements may be supported by the diaphragm. In some instances, a trench in the diaphragm may circumscribe or substantially circumscribe the perimeter of the diaphragm. In some instances, the trench may be at least partially filled with a material that has a thermal conductivity that is less than a thermal conductivity of the second wafer. Also, and in some instances, the trench may be at least partially filled with a material that provides support to the diaphragm, but this is not required in all embodiments.

In some instances, a method may be used to fabricate a sensor with a diaphragm. The method may include creating a cavity in a first side of a first wafer, where the first wafer has the first side and a second opposing side. The cavity may define a cavity edge adjacent the first side of the first wafer. In some cases the first wafer may be provided with a cavity previously formed therein. A second wafer may be bonded relative to the first side of the first wafer to form a diaphragm that extends over the cavity. The diaphragm may have a perimeter that is defined by the cavity edge of the cavity. The method may include supporting one or more sense elements on the diaphragm and forming a trench in or around the diaphragm. In some instances, the trench may be at least partially filled with a material that has a thermal conductivity that is less than the thermal conductivity of the second wafer.

The preceding summary is provided to facilitate an understanding of some of the features of the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments of the disclosure in connection with the accompanying drawings, in which.

Figure 1:
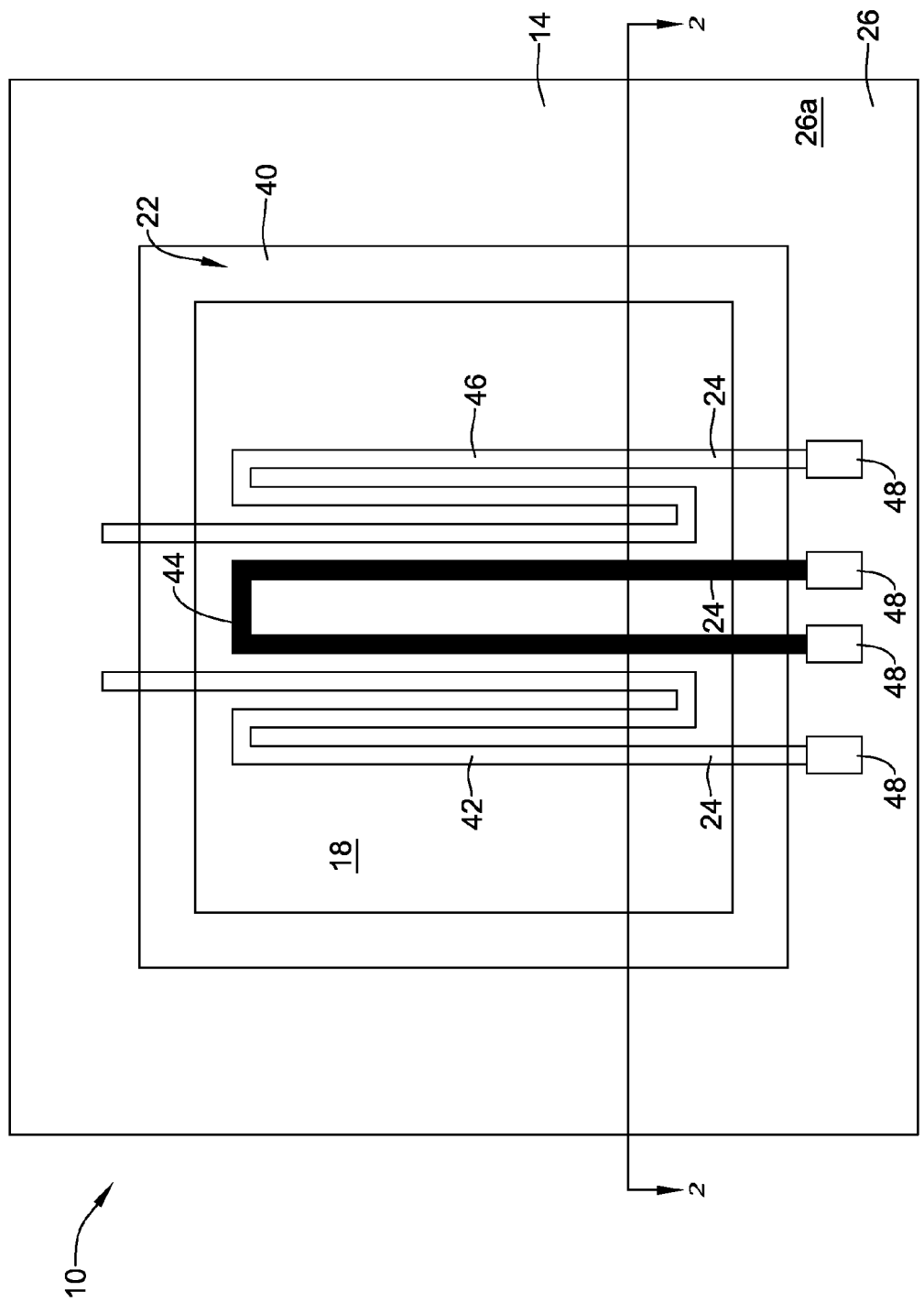
FIG. 1 is a schematic top view of an illustrative sensor assembly.

While the disclosure is amenable to various modifications and alternative forms, specifics thereof have been shown by way of example in the drawings and will be described in detail. It should be understood, however, that the intention is not to limit the disclosure to the particular illustrative embodiments described herein. On the contrary, the intention is to cover all modifications, equivalents, and alternatives falling within the spirit and scope of the disclosure.

DESCRIPTION

The following description should be read with reference to the drawings wherein like reference numerals indicate like elements throughout the several views. References to "over," "under," "top," and "bottom," etc., are relative terms and are made herein with respect to the drawings and do not necessarily correspond to any particular orientation in actual physical space. The description and drawings show several examples that are meant to be illustrative of the claimed disclosure.

Figure 2:
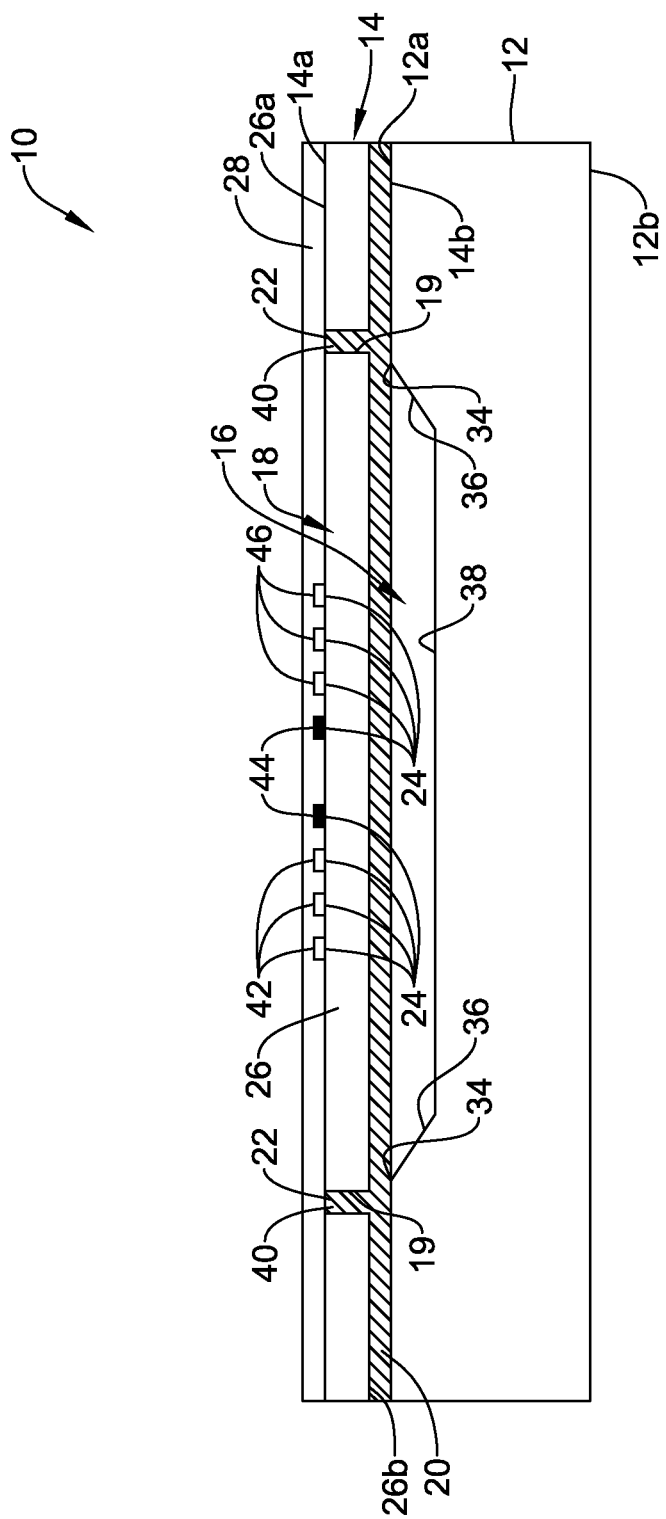
FIG. 2 is a schematic cross-sectional view of the illustrative sensor assembly of FIG. 1, taken along line 2-2 of FIG. 1, with an illustrative passivation layer added.

FIG. 1 is a schematic top view of an illustrative sensor assembly 10. While a flow sensor is shown as an example in this disclosure, it is contemplated that any suitable sensor may be provided, as desired (e.g. pressure sensor, temperature sensor, etc). FIG. 2 is a schematic cross-sectional view of the illustrative sensor assembly 10 of FIG. 1, taken along section line 2-2.

The illustrative sensor assembly 10 of FIGS. 1-2 may include a first wafer 12 (e.g., a starting wafer) and a second wafer 14, both or either which may be made of silicon and/or any other suitable material. The first wafer 12 may have a first side 12a, and a second side 12b opposing the first side 12a. The first wafer 12 may have a cavity 16 formed therein. The second wafer 14 may be positioned over the cavity 16 in a manner so as to form a diaphragm 18. The word "diaphragm" may be considered any relatively thin membrane or bridge. In a flow sensor assembly, the diaphragm 18 may help thermally isolate a heater 44 and/or one or more sense elements 46 from the first wafer 12 (see below), which may help improve the sensitivity and response time of the sensor assembly. In a pressure sensor assembly, the diaphragm 18 may actually be deformed or otherwise stressed as a result of a pressure applied by the fluid. The stress can then be detected by one or more sense elements supported by the diaphragm 18.

In some instances, the second wafer 14 may have an insulating layer 20 thereon that faces the first wafer 12 and is supported thereby. The insulating layer 20 may form a portion of the diaphragm 18, in some instances. The cavity 16 formed in the first wafer 12 may define a cavity edge 34 adjacent the first side 12a of the first wafer 12. The diaphragm 18 may extend over the cavity 16 in the first wafer 12 such that it has a perimeter 19 that is defined by the cavity edge 34 of the cavity 16. The illustrative sensor assembly 10 may include one or more sense elements 24 supported by, or to be supported by, the formed diaphragm 18 of the second wafer 14.

In some instances, a trench 22 may be formed in the second wafer 14 such that it extends around or substantially around the diaphragm 18. As used herein, the term "substantially around" may mean more than 70% around, more than 80% around, more than 90% around, more than 95% around or more. In some instances, the trench 22 may be formed to circumscribe or substantially circumscribe one or more of the sense elements 24 supported on the diaphragm 18. Alternatively, or in addition, the trench 22 may be formed to circumscribe or substantially circumscribe the perimeter 19 of the diaphragm 18.

In some cases, to assist in thermally and/or electrically isolating the diaphragm 18 (and the sense elements 24, for example) and/or for other purposes, the trench 22 may be filled with one or more materials. In one example, the trench 22 may be filled with an insulating material 40 to thermally and/or electrically isolate the diaphragm 18 (e.g., thermally and/or electrically isolate the diaphragm 18 from other portions of the second wafer 14 and/or the first wafer 12). When so provided, the insulating material 40 used to fill the trench 22 may be any thermally and/or electrically insulating material 40. For example, the insulating material 40 may be an oxide, such as silicon dioxide. In some instances, the insulating material 40 may provide some support to the diaphragm 18, particularly if/when the trench 22 extends into the diaphragm 18. Additionally, or alternatively, the insulating material 40 may be a thermally and/or electrically insulating material having a thermal conductivity that is less than a thermal conductivity of the material of the second wafer 14 or a portion of the second wafer 14 (e.g., a silicon layer 26 of the second wafer 14).

The second wafer 14 may be formed of any material, and may be formed in any manner. In one example, the second wafer 14 may be formed of silicon with an oxide layer on one side. In such instances, the second wafer 14 may be a Silicon-On-Insulator (SOI) wafer (e.g. with or without a thin silicon epitaxial layer on the opposing side of the oxide layer). Suitable materials for the second wafer 14 may include silicon, silicon oxide, silicon nitride, titanium oxide, aluminum oxide, silicon carbide, and/or any other suitable material or material combinations, as desired.

The second wafer 14 may be secured relative to the first wafer 12 in any manner. In some instances, the second wafer 14 may be bonded (e.g., fusion bonded or bonded in another manner) to the first wafer 12, or connected to the first wafer 12 in any other suitable manner, as desired. In some cases, the insulating layer 20 of the second wafer 14 may be bonded to the first wafer 12.

As shown in FIG. 2, a trench 22 in the second wafer may extend all the way through the second wafer 14, but this is not required. For example, the trench 22 may extend from a first side 14a of the second wafer 14 to a second side 14b of the second wafer 14. Alternatively, or in addition, the trench 22 may extend through a silicon layer 26 of the second wafer 14 from a first side 26a of the silicon layer 26 to a second side 26b be of the silicon layer 26, but not through the insulating layer 20.

In some instances, the sensor die may have a passivation layer 28 formed on or otherwise applied to the second wafer 14. Illustratively, the passivation layer 28 may be applied to the second wafer 14 opposite the insulating layer 20 (e.g. on an opposite side of the silicon layer 26 from the insulating layer 20). In the example shown in FIG. 2, the passivation layer 28 may be applied to a first side 14a of the second wafer 14 (e.g., a first side 26a of the silicon layer 26).

Figure 3:
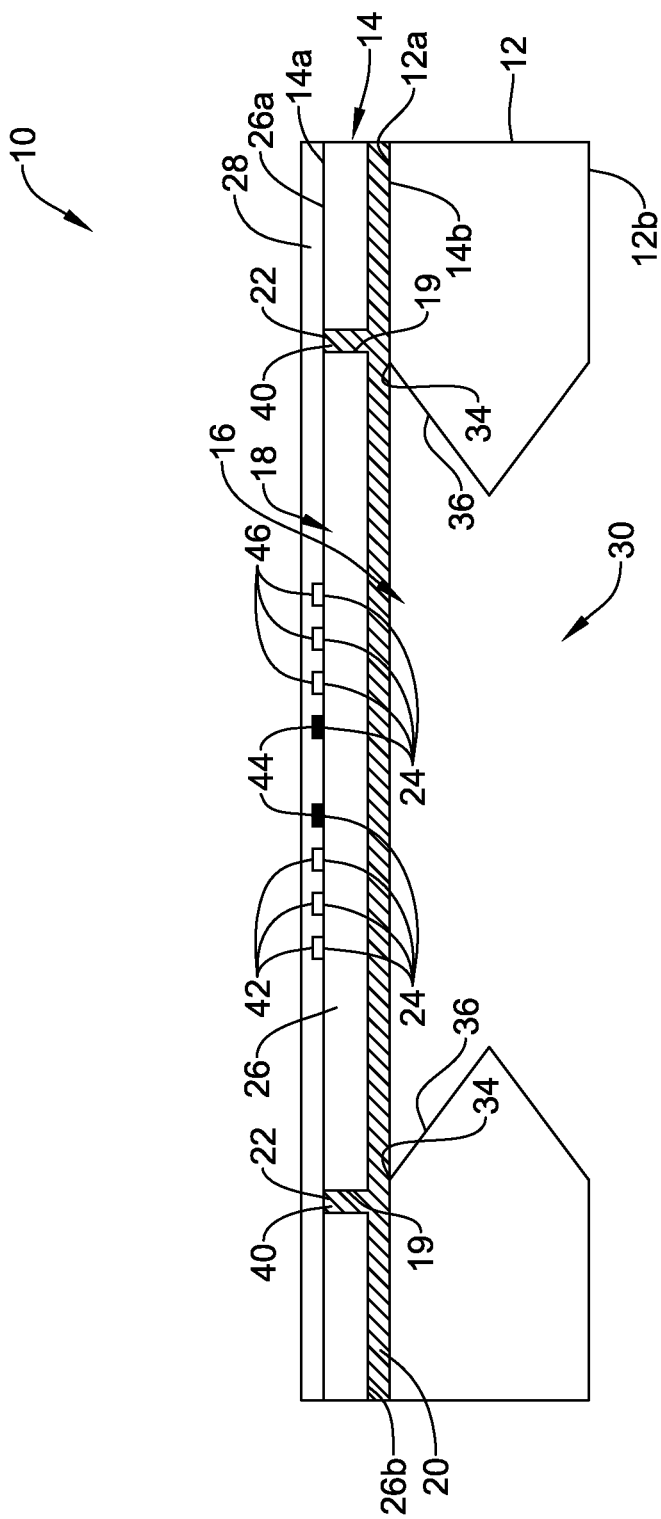
FIG. 3 is schematic cross-sectional view of an illustrative first wafer of a sensor assembly, wherein a cavity extends entirely through the illustrative first wafer.
Figure 4:
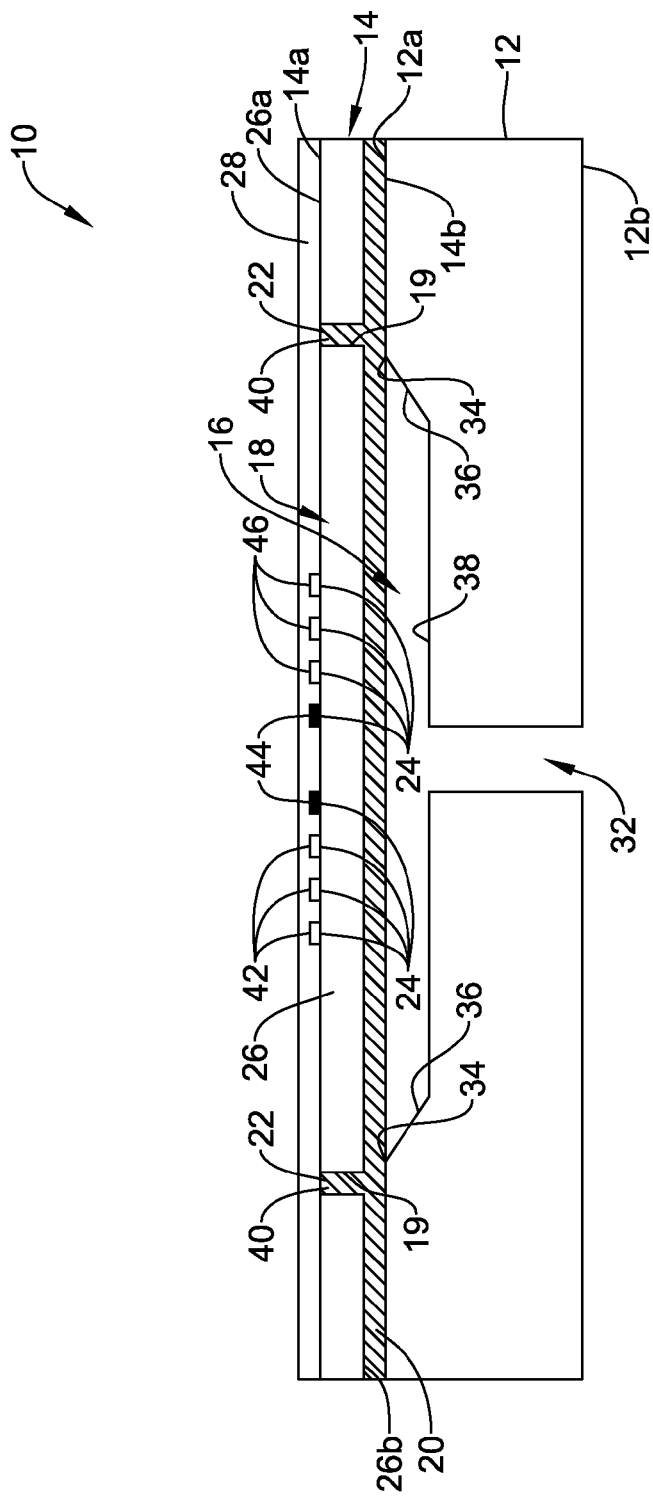
FIG. 4 is a schematic cross-sectional view of an illustrative first wafer of a sensor assembly, wherein a port extends from a cavity formed in a first side of the first wafer and extends through to a second side of the illustrative first wafer.

In some instances, the illustrative sensor assembly 10 may include one or more openings 30 extending from the cavity 16 in a first side 12a of the first wafer 12 through to a second side 12b of the first wafer 12. In one example, as shown in FIG. 3, the cavity 16 may extend entirely through the first wafer 12 from the first side 12a of the first wafer 12 to the second side 12b of the first wafer 12. In other instances, or in addition, the opening 30 in the first wafer 12 may be a port 32, as shown in FIG. 4, or other opening, extending from the cavity 16 through the second side 12b of the first wafer 12.

Figure 5A:
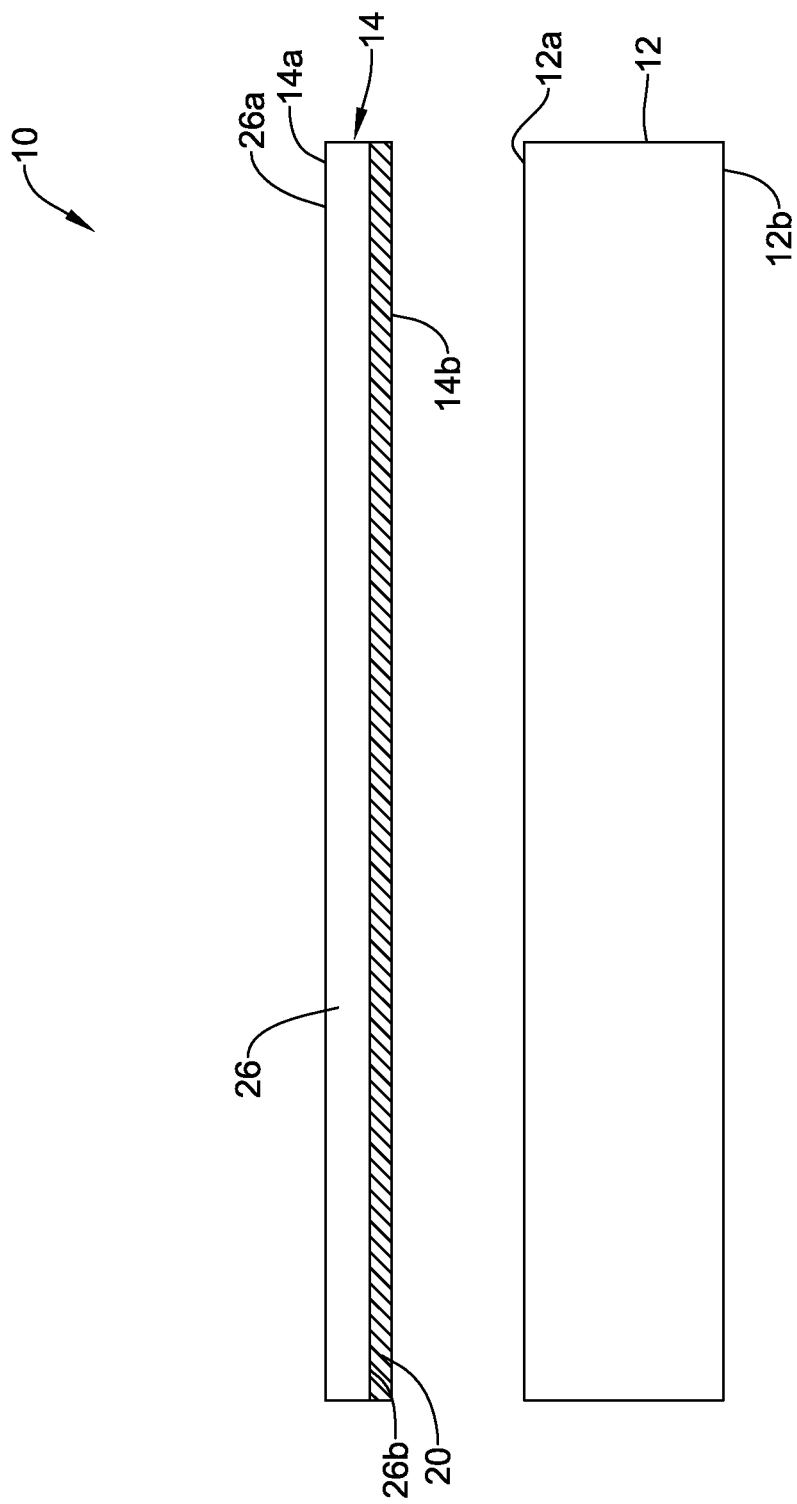
FIGS. 5A-5H illustrative schematic cross-sectional views of an illustrative sensor assembly forming process.

FIGS. 5A-5H depict a schematic method or process flow for fabricating an illustrative sensor assembly 10 having a thermally and/or electrically isolated diaphragm 18. The illustrative sensor assembly 10 may be fabricated with the first wafer 12 and a second wafer 14, as shown in FIG. 5A. The first wafer 12 may have first side 12a and second side 12b, where the first wafer may be a silicon wafer (e.g., a P-type substrate wafer or other wafer type). The second wafer 14 having first side 14a and second side 14b may have a silicon layer 26 and an insulating layer 20 (e.g., a SOI wafer forming an N-type wafer or other wafer type). A thickness of the second wafer 14 may be selected based on a desired thickness for the diaphragm 18 or based on any other factor.

Figure 5B:
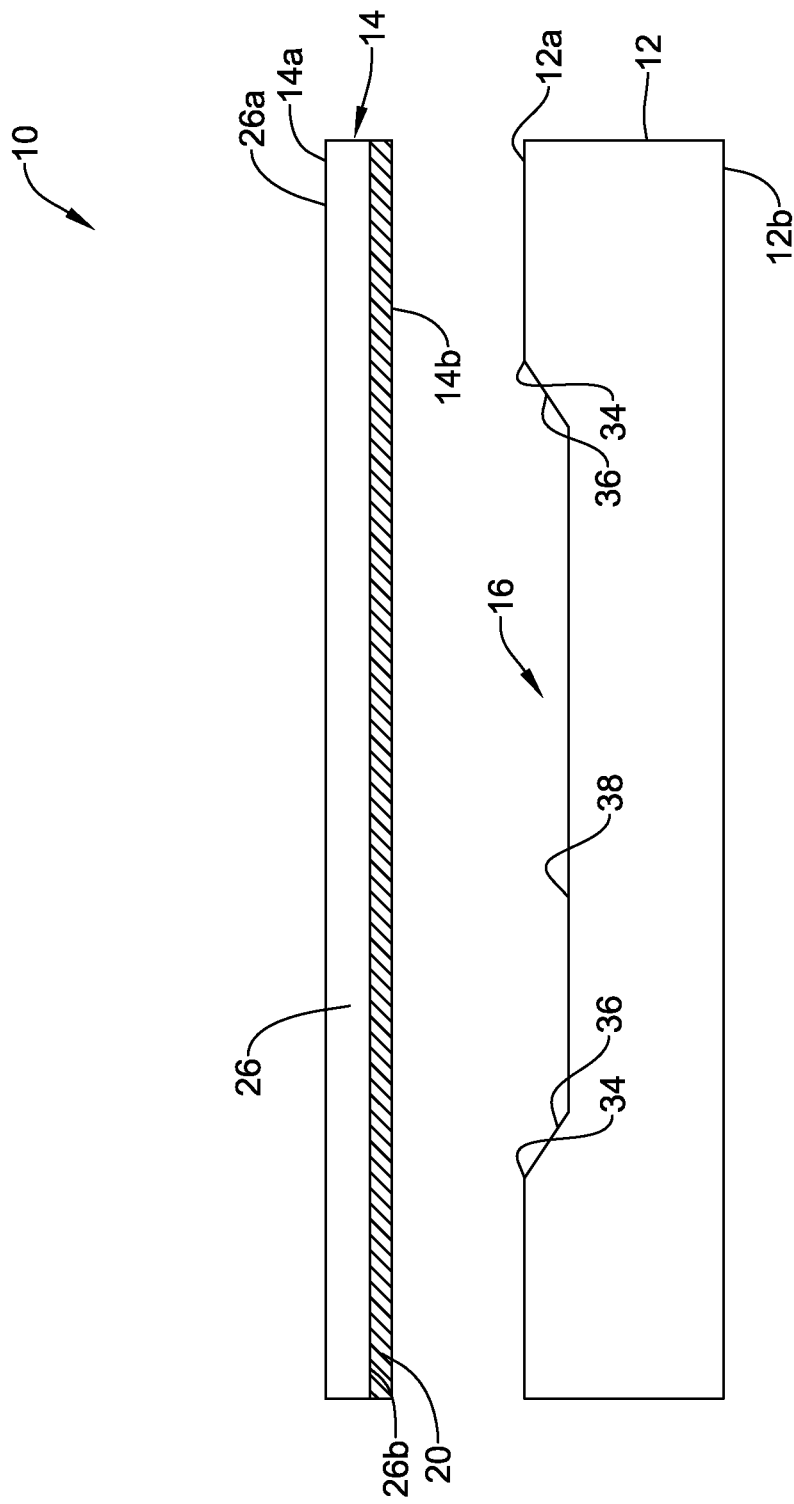

As shown in FIG. 5B, a cavity 16 may be formed in the first side 12a of the first wafer 12. The cavity 16 may be formed all of the way through the first wafer 12 from the first side 12a to the second side 12b, or as shown in FIG. 5B, may be formed partially through the first wafer 12 from the first side 12a. The cavity 16 may be formed with any cavity forming technique. For example, the cavity 16 may be patterned by etching. The etch may form the cavity 16 such that it has cavity walls 36 that generally converge from a first side 12a of the first wafer 12 (e.g., at the cavity edge 34) to the bottom 38 of the cavity 16. The depth of the cavity 16 may be controlled by adjusting an etch time. A length and/or a width or diameter of the cavity 16 at the cavity edge 34 may be selected based on a desired length and/or width or diameter of the diaphragm 18. Where the cavity 16 extends entirely through the first wafer 12, the cavity 16 may be formed with one etch or with two etches (e.g., one form the first side 12a of the first wafer 12 and one from the second side 12b of the first wafer 12), as shown in FIG. 3.

Figure 5C:
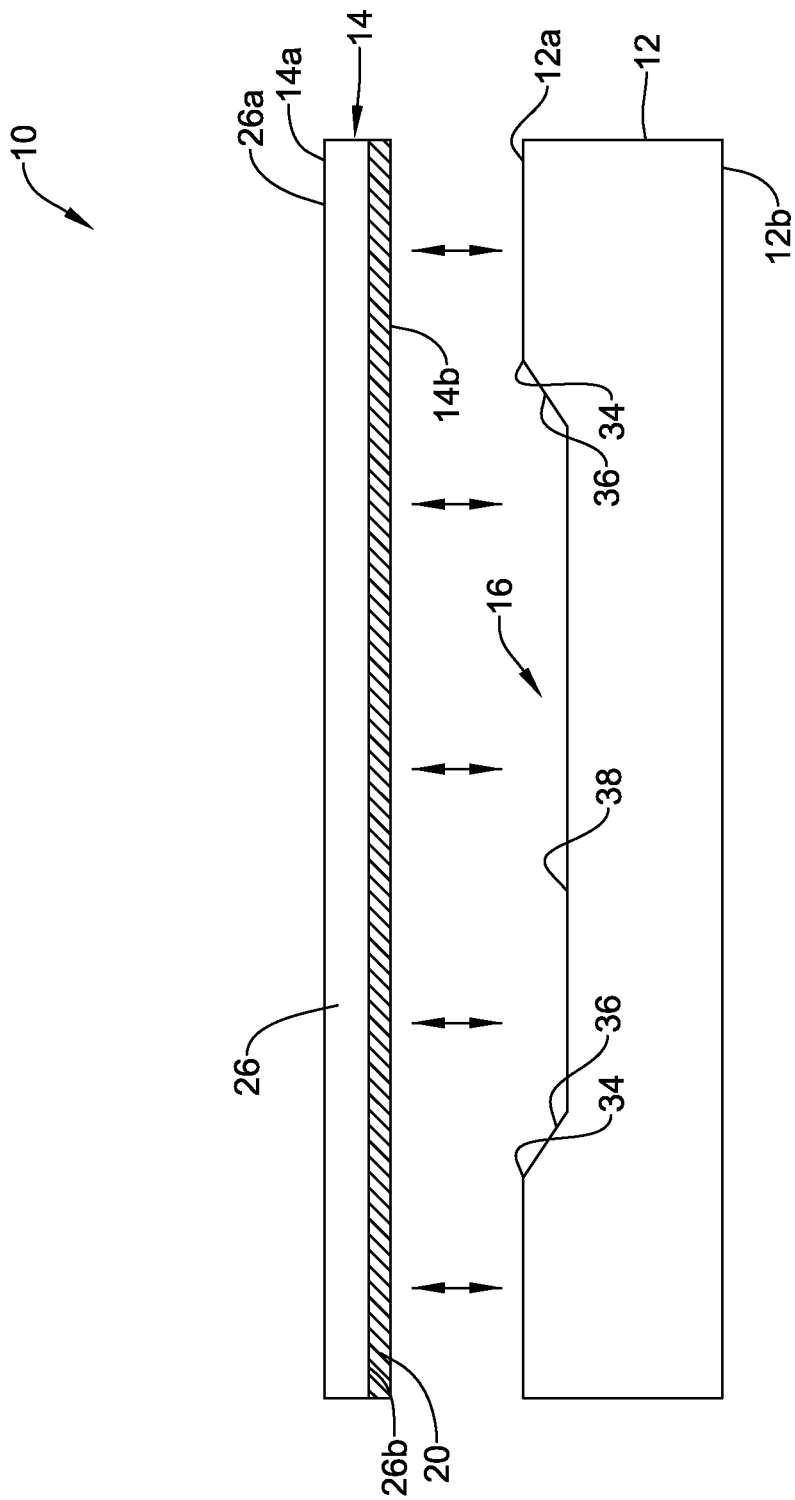
Figure 5D:
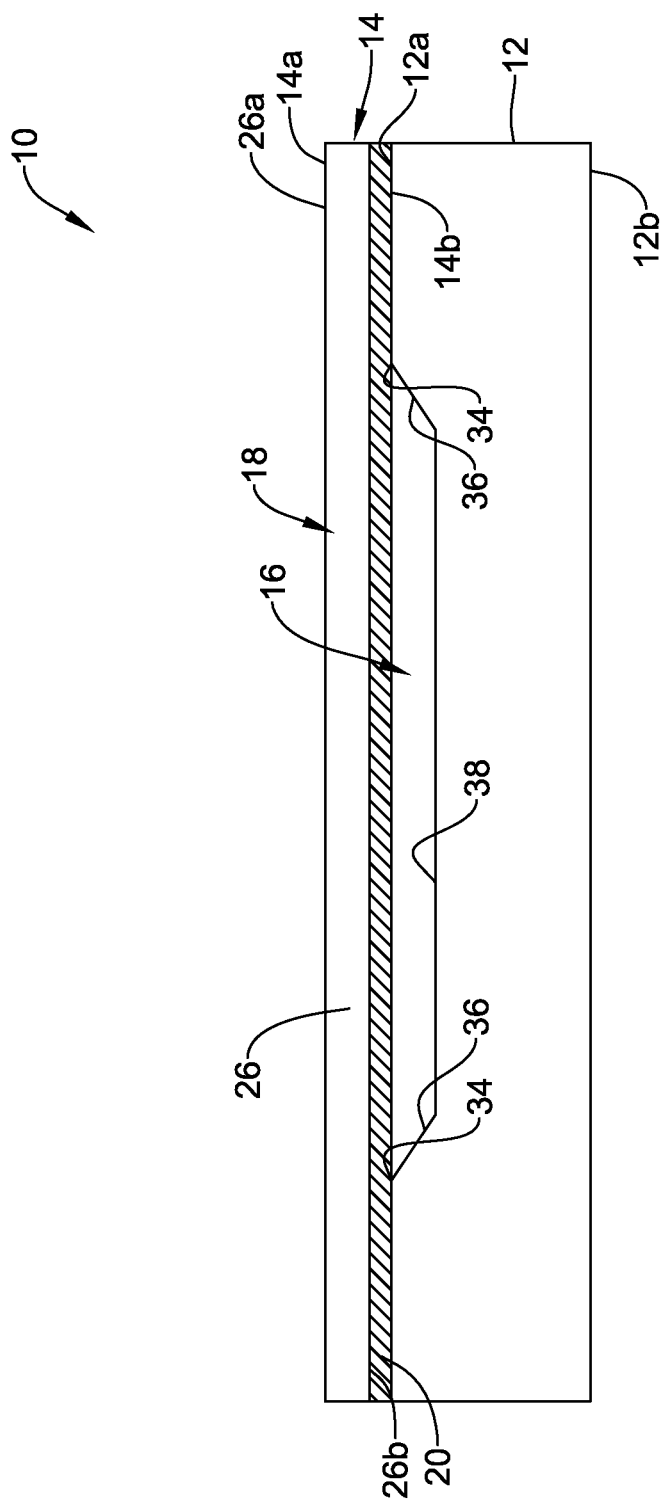

FIGS. 5C and 5D depict the connection of the second wafer 14 with the first wafer 12. In some instances, the second wafer 14 may be bonded to the first wafer 12 in any manner. In one example, the second wafer 14 may be fusion bonded to the first wafer 12 or bonded to the first wafer 12 in any other suitable manner.

Figure 5E:
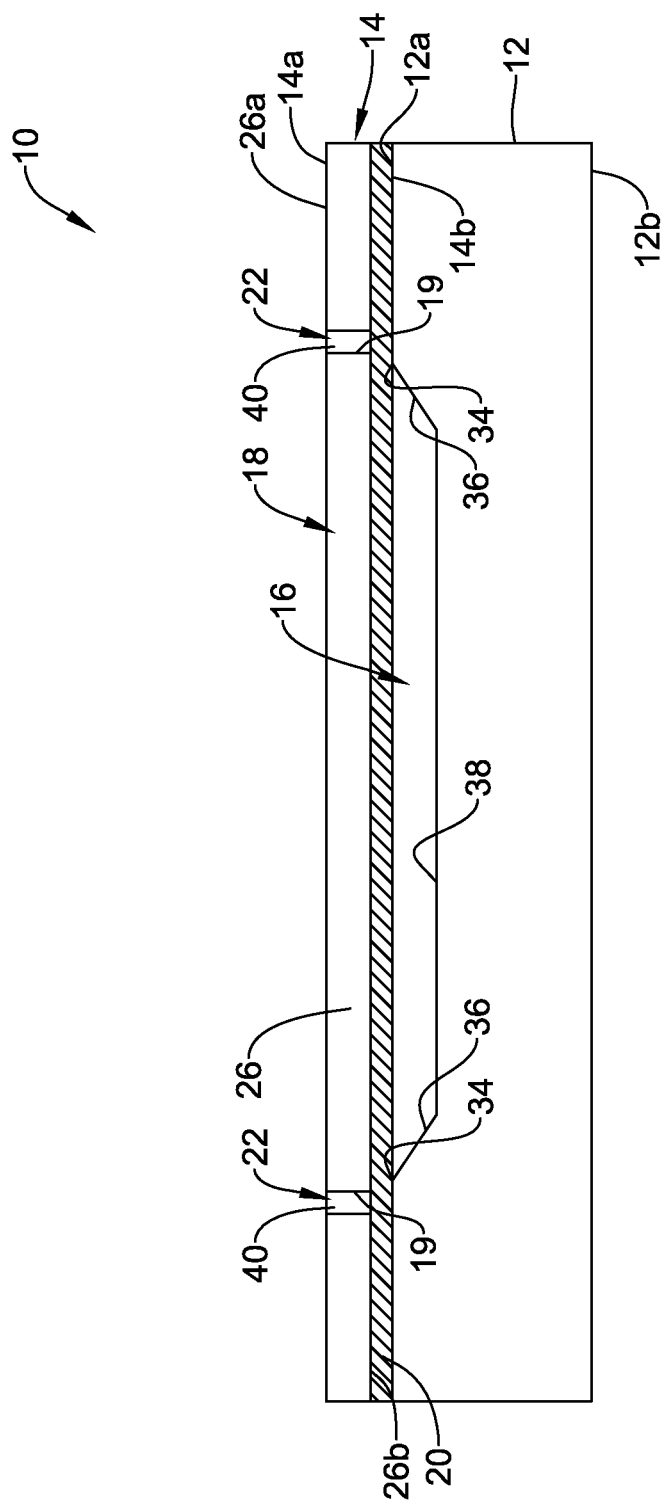

The forming of the trench 22 in the second wafer 14 is shown in FIG. 5E. The trench 22 may be formed to facilitate thermally and/or electrically isolating the diaphragm 18 from other portions of the second wafer 14 (e.g., silicon portions of the second wafer 14 that do not form the diaphragm 18). In some instances, the trench 22 may be formed to substantially surround the diaphragm 18. For example, the trench 22 may have an inner perimeter (e.g., the perimeter 19 of the diaphragm 18) that circumscribes or substantially circumscribes the cavity edge 34. Alternatively, or in addition, all or a certain portion of the trench 22 may be laterally offset inward or outward from the cavity edge 34, and/or overlap the cavity edge 34. In some instances, the trench 22 may be formed at least through an entire thickness of the silicon layer 26 (e.g., from the first side 26a of the silicon layer 26 through the second side 26b of the silicon layer 26), as shown in FIG. 5E, and optionally through the entire second wafer 14, including the insulating layer 20, but this is not required. The trench 22 may be formed in the second wafer 14 with any etching process or other trench forming process. For example, the trench 22 may be formed at least in part with a Deep Reactive-Ion Etching (DRIE) process or any other suitable process.

Figure 5F:
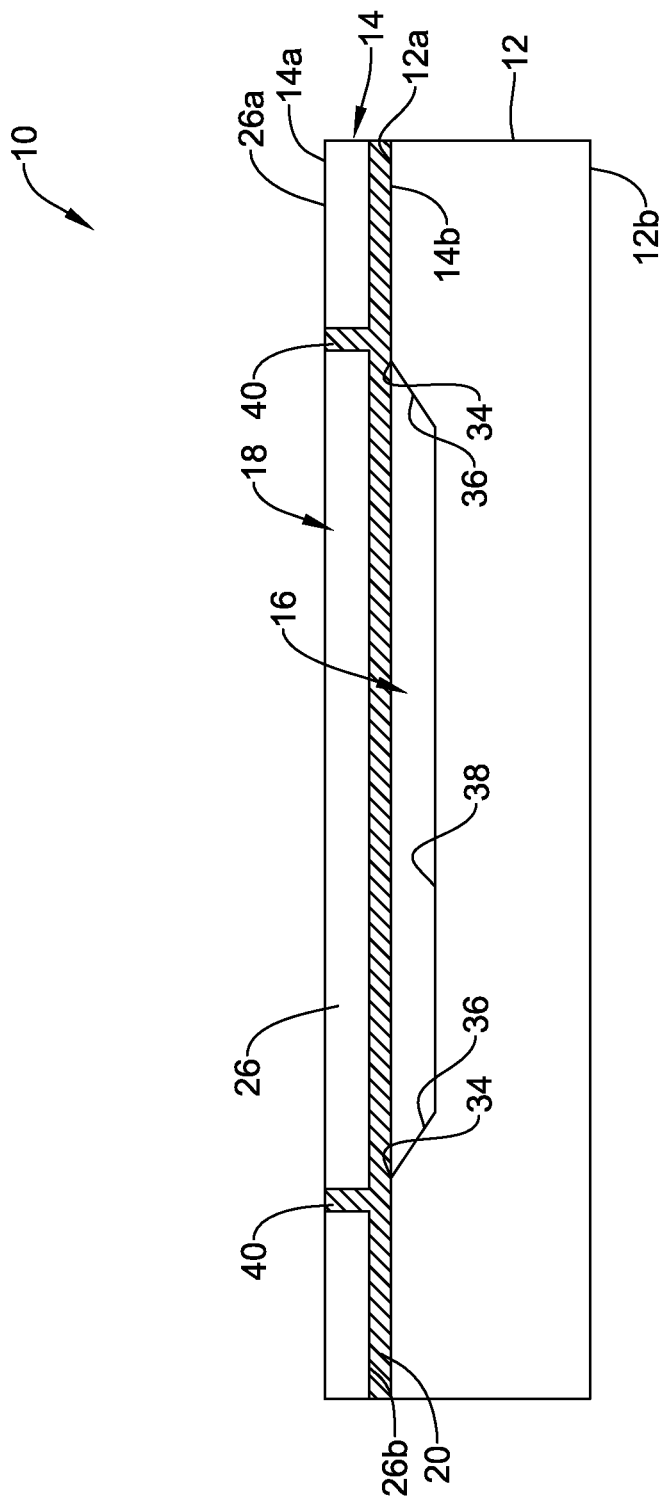

In some instances, and as shown in FIG. 5F, the trench 22 may be completely or partially filled with an insulating material 40. The insulating material 40 that fills the trench 22 may be the same material as, or may be a different material than, the material that forms the insulating layer 20. In one example, the insulating material 40 that is used to completely or partially fill the trench 22 may be a dielectric material and/or a material that has a relatively low thermal conductivity such as an oxide material (e.g., a silicon oxide or other oxide). The insulating material 40 may be applied to the trench 22 with any known deposition or application technique known in the art. Once the insulating material 40 has been deposited in or applied to the trench 22, a Chemical Mechanical Polishing (CMP) process or other process may be applied to the insulating material 40 in the trench 22 and/or to the first side 14a of the second wafer 14 if desired.

Figure 5G:
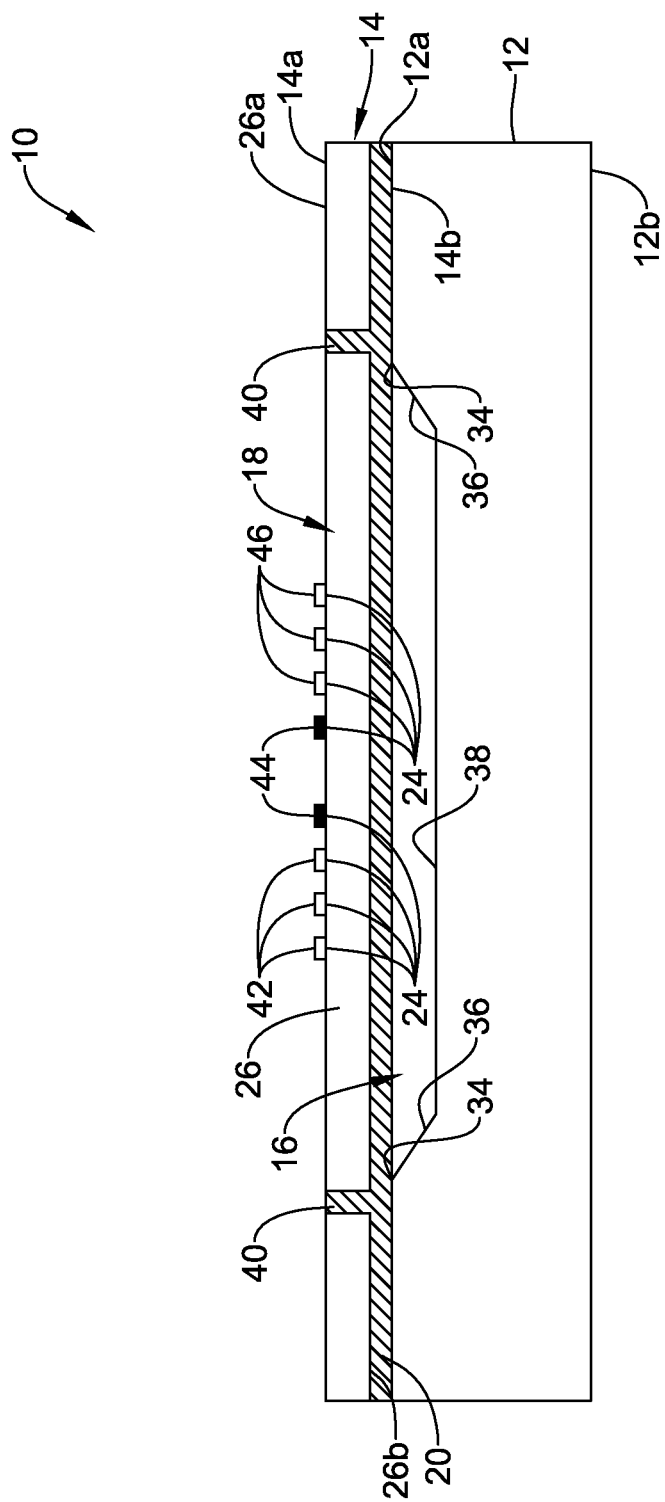

As shown in FIG. 5G, one or more sense elements 24 may be applied to the diaphragm 18 of the second wafer 14, such that the sense elements 24 are at least partially supported by the diaphragm 18. In one example, the sense elements 24 may be positioned on the diaphragm 18 such that the trench 22 may circumscribe or substantially circumscribe the one or more sense elements 24. As used herein, the term "substantially circumscribes" is defined as circumscribing greater than 70%, 80%, 90%, 95%, or more, of the way around the one or more sense elements.

The sense elements 24 may be any type of sense elements. For example, the sense elements may work with one another to sense a pressure, changes in pressure, a flow, changes in flow, temperature, changes in temperate, and/or one or more other measurands. In one instance, the sense elements may include in or more upstream resistors 42 positioned upstream of one or more heater resistors 44, and one or more downstream resistors 46 positioned downstream of the heater resistors 44.

In one example, the one or more upstream resistors 42 and the one or more downstream resistors 46 may be arranged in a Wheatstone bridge configuration, as described in, for example, U.S. Pat. No. 7,278,309, "INTERDIGITATED, FULL WHEATSTONE BRIDGE FLOW SENSOR TRANSDUCER," Dmytriw et al., which is hereby incorporated by reference in its entirety. In such a flow sensor assembly, fluid may be directed to flow past flow sensor components secured to and/or disposed in or on diaphragm 18 (e.g., sense elements 24). In one example, fluid flow may flow in a direction from the upstream resistors 42 toward the downstream resistors 46. Heater resistors 44 may dissipate electrical energy as heat, warming the fluid in its proximity. A temperature differential between the sense resistors 42 and 46 may result, depending on the flow rate of the fluid. Performance of the flow sensor may be dependent on heat transferred to the sense resistors 42 and/or 46 from the fluid, and not through other heat conduction paths. The trench 22 may help thermally isolate the diaphragm 18, the heater resistors 44, the upstream resistors 42, and the downstream resistors 46, from other areas of the second wafer 14 (and the first wafer 12).

In some instances, sense elements 24 may be formed in or on the diaphragm 18 with one or more of any suitable method. For example, resistive components may be deposited and defined on top of the diaphragm 18. A variety of resistor materials may be available, including, but not limited to, platinum, doped polysilicon, doped crystalline silicon, Permalloy, SiCr, tantalum, tantalum nitride, chromalloy, nichrome, metal silicides, and/or any other suitable material or material combination.

As discussed, the illustrative sensor assembly 10 may include other flow sensor components not disposed in or on the diaphragm 18. In some instances, wire bond pads 48 may be disposed along one or more wafer edges, or at other locations on the illustrative sensor assembly 10, as desired. Wire bond pads 48 may be capable of (and/or configured to) communicating signals relative to the one or more sense elements or sense die components, such as heater resistors 44, resistors 42, 46, and/or other resistors or other components positioned on or off the diaphragm 18. Wire bond pads 48 may include or be formed primarily of gold, copper, aluminum, or any other suitable conductor material or material combination, as desired. Traces, wire bonds, or other connectors may be provided to electrically connect the wire bond pads 48 to appropriate sense elements 24 or sensor assembly components.

Figure 5H:
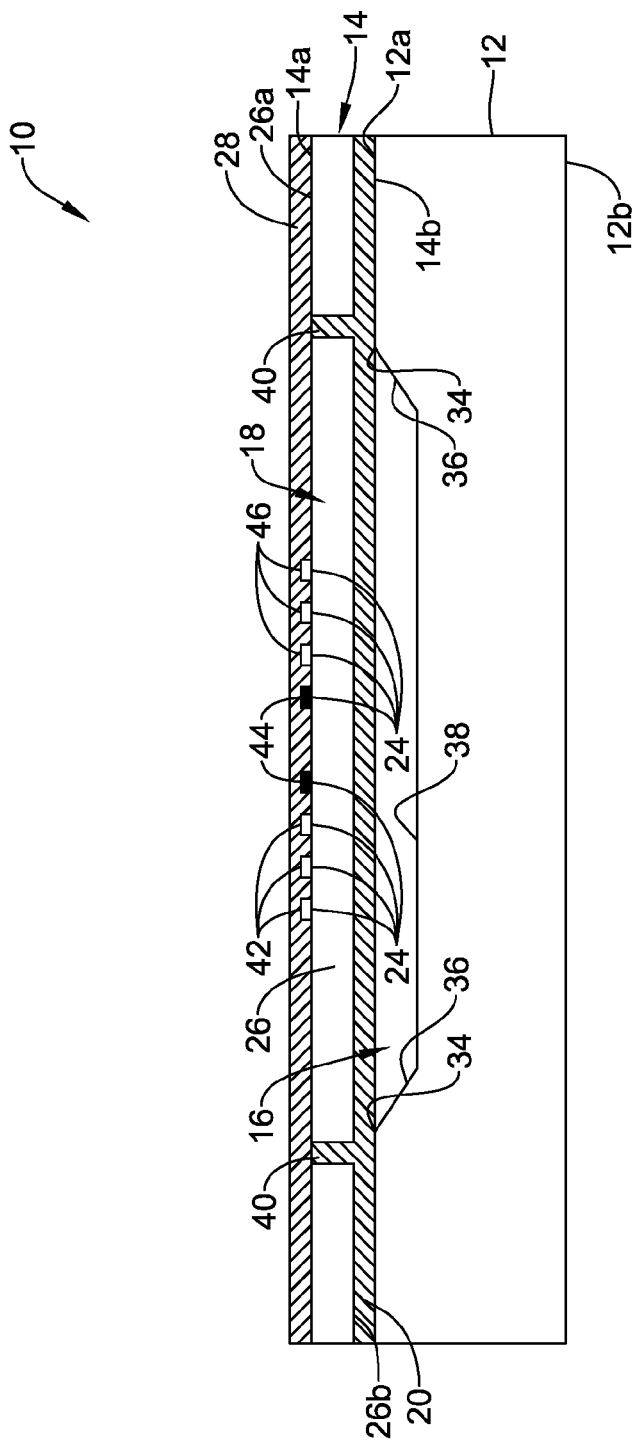

FIG. 5H depicts the process of applying a passivation layer 28 to the second wafer 14. The passivation layer may be applied by any known deposition or application process known in the art (e.g., Chemical Vapor Deposition (CVD) and/or other processes), as desired. The passivation layer 28 may include any material or combination of materials. In one example, the passivation layer 28 may be a nitride or other passivation layer material suitable for sensing dies. The passivation layer 28 may help protect the sense elements 24.

Although the processes depicted in FIGS. 5A-5H are discussed in the sequential order of the Figures, it is contemplated that one or more of the steps of the processes discussed may be performed in another order. Also, while a flow sensor is shown in FIGS. 5A-5H, it is contemplated that other sensors may be provided. For example, in a pressure sensor, the sense elements 24 may include piezoresistors, which undergo a change in resistance as the diaphragm is deformed in response to a pressure applied by a sensed fluid.

Figure 6:
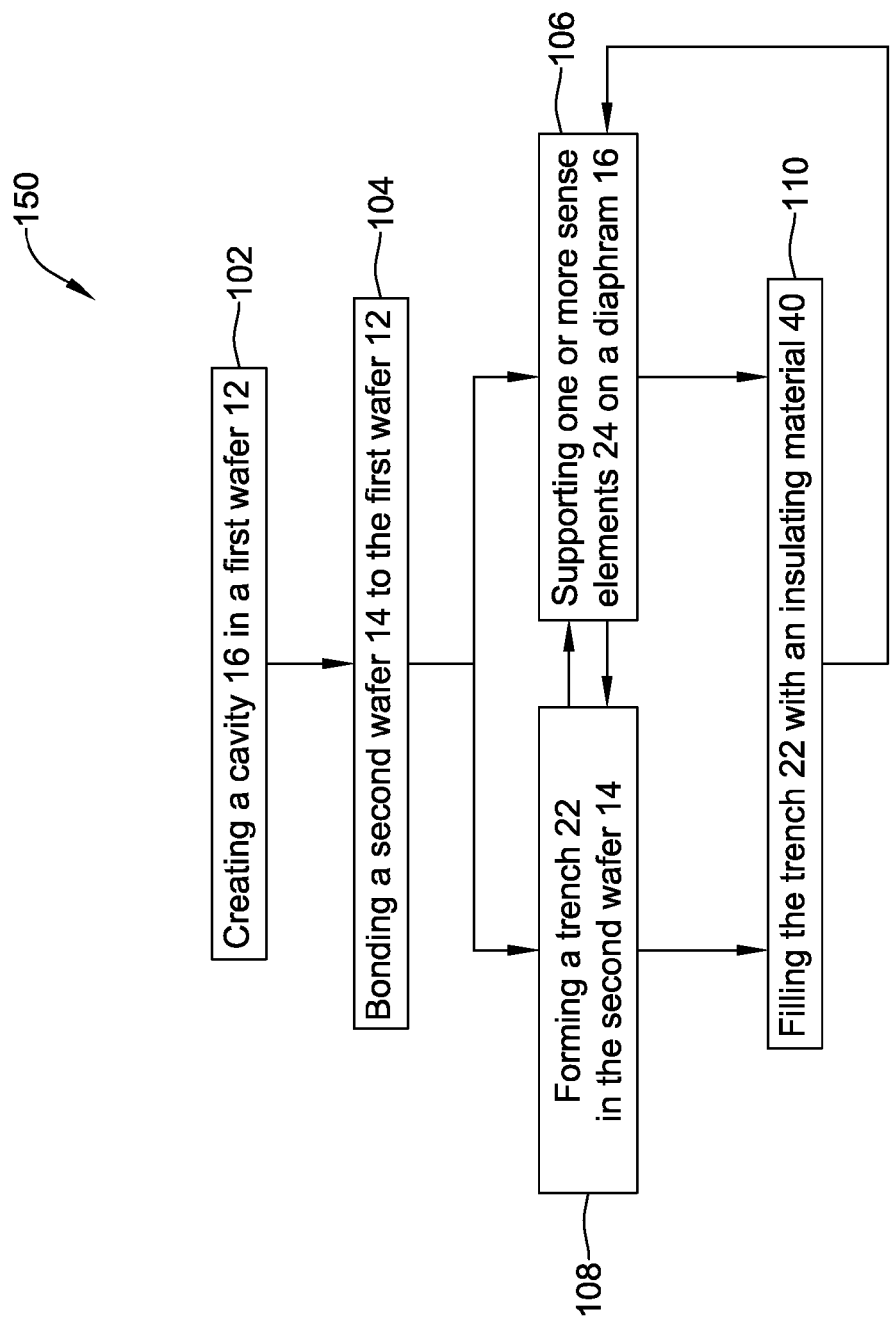
FIG. 6 is a schematic flow diagram of an illustrative method of forming a sensor assembly.

FIG. 6 is a high level flowchart that illustrates an illustrative method 150 of forming an illustrative sensor assembly 10 having a thermally and/or electrically isolated diaphragm 18. At 102, the method includes creating a cavity 16 in a first wafer 12. Where the first wafer 12 has a first side 12a and a second side 12b opposite the first side 12a, the cavity 16 may be formed in the first side 12a of the first wafer 12 such that the cavity 16 defines a cavity edge 34 adjacent the first side 12a of the first wafer 12. In some cases, the cavity 16 may extend part way through the first wafer 12 or all the way through. At 104, a second wafer 14 may be bonded relative to the first wafer 12 to form a diaphragm 18 that extends over the cavity 16. Illustratively, the diaphragm 18 may have a perimeter 19 that is defined by the cavity edge 34 of the cavity 16. At 106, one or more sense elements 24 may be supported in and/or on the diaphragm 18. At 108, a trench 22 may be formed in or around the diaphragm 18 of the second wafer 14. Where the sense elements 24 are deposited prior to forming the trench 22, the trench 22 may be formed to circumscribe or substantially circumscribe the one or more sense elements 24. Where the sense elements 24 are deposited after forming the trench 22, the trench 22 may be formed to provide space for the sense elements 24 such that the trench 22 is capable of circumscribing or substantially circumscribing the one or more sense elements 24. At 110, the trench 22 may be filled with an insulating material 40. In some instances, the insulating material 40 used to fill the trench 22 may have a thermal conductivity that is less than a thermal conductivity of the second wafer 14. Further, it is contemplated that the sense elements 24 may supported in and/or on the diaphragm 18 after or before insulating material 40 is use to fill the trench 22. In some instances, the sense elements may be electrically connected to bond pads 48 after the trench 22 has been filled at 110. Although the high level method 100 described herein is described in one or more particular orders, it is contemplated that the steps of method 100 may be performed in other orders, as desired.

The disclosure should not be considered limited to the particular examples described above. Various modifications, equivalent processes, as well as numerous structures to which the disclosure can be applicable will be readily apparent to those of skill in the art upon review of the instant specification.

What is claimed is:

1. A method of fabricating a sensor with a diaphragm, the method comprising:
   creating a cavity in a first side of a first wafer, the first wafer having the first side and a second opposing side, the cavity defining a cavity edge adjacent the first side of the first wafer;
   bonding a second wafer relative to the first side of the first wafer to form a diaphragm that extends over the cavity, the diaphragm having a perimeter that is defined by the cavity edge of the cavity;
   supporting one or more sense elements on the diaphragm; and
   forming a trench along a path that extends around the diaphragm, the trench covering at least 70 percent of the path and is at least partially filled with a material that has a thermal conductivity that is less than the thermal conductivity of the second wafer.

2. The method of claim 1, wherein the diaphragm has an electrically insulating material facing the cavity.

3. The method of claim 1, wherein the trench includes two or more spaced trench segments along the path.

4. The method of claim 1, wherein the material that fills the trench includes silicon oxide, and the second wafer includes silicon.

5. The method of claim 4, wherein the trench is filled with one of a thermal oxidization process and an oxide deposition process.

6. The method of claim 1, wherein the one or more sense elements includes one or more sense resistors positioned upstream of a heater resistor and/or one or more sense resistors positioned downstream of the heater resistor.

7. The method of claim 1, wherein the second wafer is a Silicon-On-Insulation (SOI) wafer.

8. The method of claim 7, wherein bonding the second wafer to the first wafer includes bonding an insulation layer of the SOI second wafer to the first wafer.

9. The method of claim 1, wherein the trench is formed at least in part using a Deep Reactive-Ion Etching (DRIE) process.

10. The method of claim 1, wherein the trench extends all the way through the second wafer.

11. The method of claim 1, wherein the second wafer is bonded to the first wafer with a fusion bonding technique.

12. The method of claim 1, wherein the cavity is formed all the way through the first wafer from the first side of the first wafer to the second side of the first wafer.

13. A sensor assembly, comprising:
   a first wafer having a cavity formed therein;
   a second wafer having an insulating layer thereon, the second wafer is supported by the first wafer and extends over the cavity to form a diaphragm, with the insulating layer of the second wafer facing the cavity;
   one or more sense elements supported by the diaphragm; and
   a trench in the second wafer positioned adjacent to the diaphragm and
   at least partially filled with an oxide to help thermally and electrically isolate the diaphragm.

14. The sensor assembly of claim 13, wherein the second wafer and the insulating layer are part of an SOI wafer.

15. The sensor assembly of claim 13, wherein the insulating layer is bonded to the first wafer.

16. The sensor assembly of claim 13, wherein the trench extends all the way through the second wafer.

17. The sensor assembly of claim 13, further comprising a passivation layer over the second wafer opposite the insulating layer.

18. The sensor assembly of claim 13, wherein the cavity extends all the way through the first wafer.

19. A sensor assembly, comprising:
   a first wafer having a cavity formed therein, the cavity defining a cavity edge adjacent a first side of the first wafer;
   a second wafer supported by the first side of the first wafer, wherein the second wafer extends over the cavity to form a diaphragm, the diaphragm having a perimeter that is defined by the cavity edge of the cavity;
   one or more sense elements supported by the diaphragm; and
   a trench in the second wafer situated adjacent to the perimeter of the diaphragm to help thermally isolate the diaphragm from the remainder of the second wafer.

20. The sensor assembly of claim 19, further comprising an insulating material situated in the trench, and an insulating layer situated between the first wafer and the second wafer.

* * * * *